(12) United States Patent
Wagner et al.

(10) Patent No.: US 8,840,861 B2
(45) Date of Patent: Sep. 23, 2014

(54) CRUCIBLE FOR PHOTOVOLTAICS

(75) Inventors: Rolf Wagner, Selb (DE); Manuel Matussek, Marktredwitz (DE)

(73) Assignee: H. C. Starck GmbH, Goslar (DE)

( * ) Notice: Subject to any disclaimer, the term of this patent is extended or adjusted under 35 U.S.C. 154(b) by 120 days.

(21) Appl. No.: 13/578,820

(22) PCT Filed: Jan. 14, 2011

(86) PCT No.: PCT/EP2011/050441
§ 371 (c)(1),
(2), (4) Date: Aug. 14, 2012

(87) PCT Pub. No.: WO2011/098319
PCT Pub. Date: Aug. 18, 2011

(65) Prior Publication Data
US 2012/0315208 A1    Dec. 13, 2012

(30) Foreign Application Priority Data
Feb. 15, 2010  (DE) .......................... 10 2010 008 089

(51) Int. Cl.
| | | |
|---|---|---|
| C01B 21/068 | (2006.01) | |
| C23C 24/08 | (2006.01) | |
| C04B 41/00 | (2006.01) | |
| C30B 28/04 | (2006.01) | |
| C04B 41/87 | (2006.01) | |
| C04B 41/50 | (2006.01) | |
| C30B 15/10 | (2006.01) | |
| C23C 8/24 | (2006.01) | |

(52) U.S. Cl.
CPC ........... *C04B 41/5066* (2013.01); *C23C 24/082* (2013.01); *C04B 41/009* (2013.01); *C30B 28/04* (2013.01); *C04B 41/87* (2013.01); *C30B 15/10* (2013.01); *C23C 8/24* (2013.01)
USPC .......................................... 423/344; 423/406

(58) Field of Classification Search
USPC ......................................... 423/344, 324, 406
See application file for complete search history.

(56) References Cited

U.S. PATENT DOCUMENTS

| | | |
|---|---|---|
| 2006/0251816 A1 | 11/2006 | Souto Serantes et al. |
| 2009/0031535 A1 | 2/2009 | Jonczyk |

FOREIGN PATENT DOCUMENTS

| | | |
|---|---|---|
| DE | 10 2006 003 820 A1 | 7/2006 |
| DE | 10 2005 032 790 A1 | 12/2006 |
| WO | WO 2007/148986 A1 | 12/2007 |

OTHER PUBLICATIONS

DIN ISO 13320, "Particle size analysis—Laser diffraction methods", pp. 1-60 (Dec. 1, 2009).
R. Ramachandra Rao et al: "Dispersion, Slip Casting and Reaction Nitridation of Silicon—Silicon Carbide Mixtures", Journal of the European Ceramic Society, No. 19, pp. 2145-2153.

*Primary Examiner* — Edward Johnson
(74) *Attorney, Agent, or Firm* — Norman B. Thot

(57) ABSTRACT

A method for producing a workpiece comprising a layer of an additive-free silicon nitride includes providing a base body of the workpiece. A layer of a slip comprising a silicon powder is applied to an inside of the base body so as to obtain a coated base body. The coated base body is subjected to a reactive firing under nitrogen so as to convert the silicon powder to the additive-free silicon nitride.

16 Claims, 6 Drawing Sheets

Linescan NSiC, AS/Cross section, 15kV, 12mm, 65x ├── 500 μm ──┤

US 8,840,861 B2

CRUCIBLE FOR PHOTOVOLTAICS

CROSS REFERENCE TO PRIOR APPLICATIONS

This application is a U.S. National Phase application under 35 U.S.C. §371 of International Application No. PCT/EP2011/050441, filed on Jan. 14, 2011 and which claims benefit to German Patent Application No. 10 2010 008 089.6, filed on Feb. 15, 2010. The International Application was published in German on Aug. 18, 2011 as WO 2011/098319 A1 under PCT Article 21(2).

FIELD

The present invention relates to the production of a crucible for photovoltaics. In photovoltaics, and also for the drawing of single crystals of silicon, current practice is to use crucibles made from $SiO_2$, which allow only a single use. A $SiO_2$ crucible is firstly exposed to deformation as a result of the high temperatures during silicon melting (approximately 1500° C.), and, secondly, the $SiO_2$ material, in the course of the change in temperature, passes through a number of modifications of the quartz, and so that it ruptures and can no longer be used after the operation. A conventional $SiO_2$ crucible is destroyed during the silicon melting process and is therefore a disposable article which can be used only once.

BACKGROUND

The present invention provides crucibles for multiple use, as, for example, for a service life of at least five production cycles, in order to achieve an increase in economy in comparison with a conventional $SiO_2$ crucible.

Nitride-bonded silicon carbide (also called NSiC) is a firing aid used primarily as a support structure in the fast firing of porcelain. The production of nitride-bonded silicon carbide is adequately described in the literature. Owing to its chemical composition, NSiC cannot be used directly as a crucible material.

Another firing aid is graphite. This material is also used commercially to produce crucibles. Since, however, carbon undergoes a reaction with silicon to form SiC, graphite too cannot be used directly as a crucible for the melting of silicon. If, for example, silicon is melted directly in a graphite crucible, the graphite of the crucible reacts to form silicon carbide, and, consequently, the crucible is destroyed. Accordingly, it cannot be used directly as a crucible for silicon melting.

From numerous prior attempts, the literature describes that silicon nitride is a suitable material. Silicon nitride ($Si_3N_4$) is a material used to manufacture high-grade components for industrial use. Pure silicon nitride powder cannot be compacted to a solid body by temperature treatment without additions ("pure silicon nitride" for the purposes of this specification means an additive-free silicon nitride, in other words, a silicon nitride having no added additives or additive systems). Such a silicon nitride may nevertheless contain minor amounts of impurities.

The known silicon nitride material is "conventional" silicon nitride ($Si_3N_4$) with the corresponding additive systems in order to achieve complete compaction. The reference here generally is to what is called a "closed porosity" and to a dense silicon nitride with densities of more than 97%, based on the theoretical density of the sintered silicon nitride, depending on the selected additive system, of >3.2 g/cm$^3$. In order to achieve this degree of density, oxidic additives such as $Al_2O_3$, $Y_2O_3$ and other oxides of the rare earths are used. Additives from the group of the alkaline earth metal elements as well, such as MgO, for example, have been described. All of these additives result in a compaction process during sintering that is accompanied by a linear contraction of approximately 20%. These additives, however, prevent use as a solar crucible, since Al in particular has an adverse effect on the properties of the solar cells.

WO 2007/148986 from Rec Scanwafer AS describes a mixture of metallic silicon and silicon nitride for producing rectangular crucibles, similarly to RBSN (i.e., reaction-bonded silicon nitride).

DE 10 2005 032 790 A1 describes a base container body, constituting a fired mould or a green mould, which is intended as a container for the melting of non-ferrous metals, and especially of silicon. The container has a coating which comprises at least one of the compounds silicon nitride or silicon dioxide, and the concentration of the silicon dioxide may increase towards the crucible wall. The admixing of silicon dioxide has the advantage of resulting in improved adhesion of the silicon nitride powder on the substrate, such as the wall of an $SiO_2$ crucible. It is thereby generally necessary to admix the powder with an organic constituent for adhesion to the container wall. Prior to use, the container may also be subjected to a temperature treatment, in which case, in contrast to the present invention, there is no compaction of the layer through sintering or reaction. If, however, a temperature treatment takes place, the organic binder is combusted, and a loose powder layer remains. This procedure can occur only with a quartz crucible, since these crucibles are used only once in any case. Moreover, the increasing $SiO_2$ gradient in the crucible direction is an indicator of the use of an $SiO_2$ crucible. Even if the quartz crucible were to be used a number of times, the powder layer would lose its adhesiveness because of the absence of a binder fraction. The layer therefore does not adhere firmly, and consequently, can be used only once.

DE 10 2006 003 820 A1 describes a silicon nitride coating on mouldings of silicon dioxide ($SiO_2$). The silicon nitride layer is produced by application of a layer of Si, followed by subsequent nitriding. In the case of graphite/carbon-based base bodies, coating by means of pure Si is not possible since silicon carbide forms preferentially instead of silicon nitride. Silicon carbide, however, is not a suitable release layer for use for the melting of solar silicon.

Nitride-bonded silicon carbide (i.e., NSiC) is a well-known firing aid. The literature describes the production of a material from nitride-bonded silicon carbide. One production method is the shaping of components by way of slip casting. A mixture of silicon carbide powder and silicon powder is thereby processed to nitride-bonded silicon carbide via a nitriding operation. Optimized production of this material in different grain sizes is described in the literature, through the selection of auxiliaries. NSiC, however, contains a carbidic fraction which is not suitable for the melting of silicon, and particularly not of pure or high-purity silicon. The silicon melt must therefore be protected from direct contact with the NSiC.

SUMMARY

An aspect of the present invention is to provide a material or moulding having high resistance to fluctuating temperatures and a high purity so that it can be used for photovoltaic applications. Another aspect of the present invention is to provide a moulding or material, more particularly, a crucible, for the melting of silicon, more particularly, of pure or ultra-pure silicon, which features a service life of at least five production cycles. The moulding or crucible should furthermore provide high resistance to fluctuating temperatures and a high purity. The material or moulding should be suitable for the production of metallic melts, and in particular, for the melting of pure silicon, and more particularly, ultrapure silicon. The material should, in particular, not to be wettable for melting of non-ferrous metals and silicon. A further aspect of the present invention is to provide crucible materials which were hitherto unsuitable for use for silicon melting on account of their reactivity.

In an embodiment, the present invention provides a method for producing a workpiece comprising a layer of an additive-free silicon nitride which includes providing a base body of the workpiece. A layer of a slip comprising a silicon powder is applied to an inside of the base body so as to obtain a coated base body. The coated base body is subjected to a reactive firing under nitrogen so as to convert the silicon powder to the additive-free silicon nitride. A protective layer is thereby formed which prevents contact between the silicon melt and the material of the base body of the crucible. The method provides a material or moulding having high resistance to fluctuating temperatures and a high purity, allowing it to be used for photovoltaic applications. A moulding of high purity within the context of the present invention means a moulding which comprises ≥99% $Si_3N_4$.

BRIEF DESCRIPTION OF THE DRAWINGS

The present invention is described in greater detail below on the basis of embodiments and of the drawings in which.

DETAILED DESCRIPTION

Figure 1:
FIG. 1 is a cross section of a picture taken with a scanning electron microscope showing a crucible.

In an embodiment of the present invention, the layer of pure silicon nitride may be applied as follows: if the base body comprises nitride-bonded silicon carbide (also identified below as NSiC), i.e., if the base body prior to firing constitutes a mixture of fine and coarse silicon carbide and silicon powder, the base body can, for example, be coated with a slip comprising pure silicon powder as the sole inorganic constituent of the slip. In this context, the term "reaction-bonded silicon nitride (RBSN)" is used. In the context of the present invention, this term means a material whose raw material is pure silicon which by reactive firing in a stream of nitrogen is converted to silicon nitride.

Pure silicon in the context of the present invention means a silicon which comprises no additives or other adjuvants and has a silicon content of ≥99% by weight. The high-purity silicon has a silicon content of ≥99.9% by weight.

Alternatively, in place of nitride-bonded silicon carbide, it is possible to use carbon-based materials such as, for example, graphite, carbon fibre-reinforced carbon (CFC), or mixtures of graphite and CFC as material for the base body. The carbon-based crucible materials have the advantage that they are available commercially in many sizes and also in different grades in relation to purity. These crucibles are furthermore already used as support crucibles for fused-quartz crucibles in the melting of silicon in the solar industry. If these crucibles are to be used directly, it would then be possible to replace the quartz crucibles by the graphite crucibles, producing a commercial advantage. In order to allow carbon-based crucibles to be used directly for silicon melting, they have to be protected from the silicon.

For the coating of carbon-based crucibles, and more particularly graphite, coating with a slip of 60%-80% by weight silicon nitride and 20%-40% by weight silicon can occur. This coating of a mixture of pure silicon nitride and pure silicon is also converted to pure silicon nitride by reactive firing in a stream of nitrogen.

As a result of this layer of pure silicon nitride, it is possible to achieve a greater protective effect with respect to metallic melts, and especially silicon, such that the melt of pure silicon has no contact with the base body of the crucible. More particularly, the applied layer of (reaction-bonded or nitride-bonded) silicon nitride is not wetted by the silicon melt. There is always only a certain fraction of silicon powder present which is reacted by reactive firing to form silicon nitride, so leading to the formation of a solid assembly with the silicon nitride grains. The layer therefore adheres firmly to the crucible material, so that the crucible can be used more than once.

In an embodiment of the present invention, a base body of nitride-bonded silicon carbide as base material (NSiC) is first produced. This base body is also referred to below simply as the body. The nitride-bonded silicon carbide is notable for very high resistance to fluctuating temperatures, and can be produced inexpensively. Nitride-bonded silicon carbide is used commonly as a firing aid, but has a lack of purity that makes it unsuitable for use as a crucible material for photovoltaic applications. The lack of purity of the nitride-bonded silicon carbide is a consequence of additives such as for example, $Al_2O_3$ or $Fe_2O_3$. A further disadvantage of nitride-bonded silicon carbide lies in its wettability for melts of non-ferrous metals, such as, for example, silicon melts. It is therefore not contemplated for the intended use. In order to be able to use nitride-bonded silicon carbide for the production of photovoltaic silicon, further modification is therefore required.

Nitride-bonded silicon carbide is produced from coarse (particle size 100 μm) and fine (particle size ≤10 μm) silicon carbide, silicon (particle size ≤20 μm) and aluminum oxide as additive.

If the mixture of coarse and fine silicon carbide, silicon and aluminum oxide contained in the body were to be fired in a stream of nitrogen, thereby converting the silicon to silicon nitride by reactive firing, the material obtained would have a lack of purity making it unsuitable for use as crucible material for photovoltaic silicon melts. The aluminum in particular would act as a contaminant of the silicon melt.

Owing to the lack of purity of the body in the unfired state and its wettability for silicon melts, the present invention applies a (further second) layer of pure or high-purity silicon to the inside of the body, i.e., of the workpiece comprising the base material. The application of the (second) layer of pure or high-purity silicon can be accomplished either by the process of slip casting, by spraying using a nozzle or by brush application.

If the second layer of pure silicon is to be applied by means of slip casting, the body made from the NSiC base material is first produced by a first slip casting operation. After the body has been formed, the first slip is cast, and without removing the resulting body from the mould, a further slip is cast in, comprising pure silicon. If the base body of the crucible comprises nitride-bonded silicon carbide, pure silicon powder can, for example, be the only inorganic constituent of the second layer, i.e., the insulating protective layer. Besides the pure silicon, the slip for the insulating protective layer may also comprise pure silicon nitride powder. A layer comprising high-purity silicon is formed in this way on the inside of the crucible. The thickness of this layer can be varied and is in the range from 0.5 mm and 3 mm in the green state; it is determined by the residence time of the slip in the crucible or plaster mould. The crucible is then removed from the plaster mould.

The term "slip" defines a suspension of a metallic and/or ceramic powder in a solvent, particularly in water. Slip casting presupposes an absorbent casting mould, made of plaster, for example, which draws up the water present in the slip. Slip casting can therefore be used when not only the base body but also the insulating second layer are to be produced from pure silicon (or pure silicon nitride after reactive firing) by slip casting. An example of the use of slip casting lies in the use of a base body made from nitride-bonded silicon carbide. In this case, the second layer of pure silicon or silicon nitride can be simply "slip-applied"—that is, by emptying out the first slip, which serves to form the base body of nitride-bonded silicon carbide, without removal of the body of the base body from the plaster mould, and by introducing the second slip, which serves to form the insulating second layer of pure silicon powder (before the reactive firing) or pure silicon nitride (after the reactive firing). Through this method, it is possible to produce not only the base body but also the insulating interlayer with one plaster mould without great effort or expense.

In an alternative procedure, the second layer, comprising high-purity silicon, can be applied to the body or graphite by means of a spraying process. As compared with the slip casting process above, this process has the advantage that relatively thin layers of pure silicon can be produced and, accordingly, less slip containing the expensive pure silicon is required. This argument is of interest especially if high-purity silicon is to be used. If graphite is used as the base material, the application of the layer of pure silicon can, for example, be accomplished by spray application of the slip. In an alternative procedure, the slip may be brushed onto the base body for the purpose of forming the insulating layer of pure silicon or silicon nitride.

The thickness of the insulating interlayer after reactive firing is at least 0.2 mm to not more than 2.0 mm. If the layer thickness after reactive firing is more than 2.0 mm, there is an increased risk of delamination of the layer; if, on the other hand, it is less than 0.2 mm, there is an increased risk of contact between silicon melt and base material.

The pure silicon powder used for the insulating layer can, for example, have a $D_{98}$ of less than or equal to 20 µm and/or a $D_{50}$ of less than or equal to 4 measured with a Coulter Beckmann 13320 granulometer in accordance with standard ISO 13320. Since the silicon is applied as an independent layer, other powders can also be used, i.e., both coarser powders and finer powders.

With regard to the purity of the silicon powder used, use is made, for example, of Si HQ from Elkem or Vesta Ceramics, Grade 4, Type E. Finer solar silicon powder may also be used. The silicon powder intended for formation of the interlayer can, for example, comprise less than or equal to 1000 ppm, for example, less than or equal to 100 ppm, for example, less than or equal to 10 ppm, for example, less than or equal to 1 ppm, of aluminum, based on the weight. The silicon powder also, for example, comprises less than or equal to 1000 ppm, for example, less than or equal to 100 ppm, for example, less than or equal to 10 ppm, for example, less than or equal to 1 ppm, of iron, based on the weight. The silicon powder can, for example, comprise less than or equal to 100 ppm, for example, less than or equal to 10 ppm, for example, less than or equal to 1 ppm, of calcium, based on the weight.

Typical data for the silicon (from Elkem, silicon HQ; from Vesta Ceramics, Grade 4, Type E) are given in the table below:

| Impurity | Vesta Ceramics, Sicomill ® Grade 4 Type E Silicon | Elkem silicon HQ (Silgrain ®) |
|---|---|---|
| Silicon | | 99.7% by weight |
| Aluminum | <0.01% by weight | 0.09% by weight |
| Iron | 0.07% by weight | 0.035% by weight |
| Calcium | 0.01% by weight | 0.01% by weight |
| Carbon | 0.11% by weight | |
| Unavoidable impurities (Ti, B, P) | | 0.165% by weight |

| Particle size distribution | Measured with Malvern Mastersizer | Size (general) |
|---|---|---|
| $D_{10}$ | 1.05 µm | 0.2-0.8 mm |
| $D_{50}$ | 4 µm | |
| $D_{90}$ | 8.18 µm | |
| $D_{99.9}$ | 20 µm | |

In an alternative procedure, the pure silicon powder used for the layer may further comprise pure silicon nitride powder in the slip. The composition of such a slip is 55%-90% by weight silicon nitride and 10%-45% by weight silicon, for example, 65%-75% by weight silicon nitride and 25%-35% by weight silicon, for example, 68%-72% by weight silicon nitride and 28%-32% by weight silicon, for example, 70% by weight silicon nitride and 30% by weight silicon. The percentages are based on the sum of the inorganic fractions, i.e., the silicon, and the ceramic fractions in the slip, i.e., on the sum of Si and $Si_3N_4$, but not on any organic auxiliaries that may be added in order to produce the slip. The silicon nitride powder additionally present has the effect, so to speak, of "diluting" the silicon in the insulating second layer; this procedure, the addition of silicon nitride, is employed particularly when the material of the base body is graphite.

The pure silicon nitride powder used for the insulating layer can, for example, have a $D_{98}$ of less than or equal to 10 µm and/or a $D_{50}$ of less than or equal to 2.5 µm. The $D_{90}$ of the pure silicon nitride powder is, for example, less than or equal to 1.3 and/or the $D_{50}$ is less than or equal to 0.6 µm. The particle sizes were measured with a Coulter Beckmann 13320 granulometer in accordance with standard ISO 13320.

The silicon nitride powder intended for the formation of the interlayer preferably comprises less than or equal to 1000 ppm, for example, less than or equal to 800 ppm, for example, less than or equal to 50 ppm, for example, less than or equal to 1 ppm, of aluminum, based on the weight. The silicon nitride powder also comprises, for example, less than or equal to 400 ppm, for example, less than or equal to 80 ppm, for example, less than or equal to 10 ppm, for example, less than or equal to 1 ppm, of iron, based on the weight. The silicon nitride powder also comprises, for example, less than or equal to 200 ppm, for example, less than or equal to 100 ppm, for example, less than or equal to 10 ppm, for example, less than or equal to 1 ppm of calcium, based on the weight.

In order to produce the insulating interlayer, $Si_3N_4$ powder from H.C. Starck can, for example, be used. Depending on the requirements with regard to the purity of the starting material, use may be made, for example, of H.C. Starck $Si_3N_4$ grade S, $Si_3N_4$ grade M11 or $Si_3N_4$ grade HP. Typical values for the metallic impurities in $Si_3N_4$ raw materials from H.C. Starck are given in the table below:

|  | $Si_3N_4$ grade S | $Si_3N_4$ grade M11 | $Si_3N_4$ grade M11 HP |
|---|---|---|---|
| Impurity |  |  |  |
| Aluminum | <0.1% | <0.08% | <0.005% |
| Iron | <0.04% | <0.008% | <0.001% |
| Calcium | <0.02% | <0.01% | <0.001% |
| Particle size distribution |  |  |  |
| $D_{50}$ | <2.5 µm | 0.6 µm | 0.6 µm |
| $D_{90}$ | <10 µm ($D_{98}$) | 1.3 µm ($D_{90}$) | 1.3 µm ($D_{90}$) |

The particle sizes were measured with a Coulter Beckmann 13320 granulometer in accordance with standard ISO 13320.

Independently of the process for applying the layer of high-purity silicon or silicon nitride, the workpiece is subjected to residual drying at approximately 80 to 120° C. In a subsequent reactive firing under flowing nitrogen gas at 1400 to 1600° C., the silicon present in the second layer is converted to silicon nitride. The use of high-purity silicon in the inner layer means that pure silicon nitride, without disruptive additives, is also formed. Since silicon is used at least partly in the base body as well (in the case of NSiC), the reaction step produces a firm bond between the base crucible of nitride-bonded silicon carbide and the inner layer of pure silicon nitride.

The applied silicon nitride must adhere very well to the NSiC base material of the body. The reactive firing, in the course of which the silicon is converted into silicon nitride, takes place in a single step, i.e., both the pure silicon present partly in the body, in the applied (second) layer, are converted uniformly or totally to silicon nitride by a single firing operation in a stream of nitrogen at 1400 to 1600° C. The result is a particularly firm bond of the layer of pure silicon or pure silicon nitride to the body comprising nitride-bonded silicon carbide. The task of adhering the $Si_3N_4$ layer on the body is therefore accomplished by virtue of the fact that, because of a uniform matrix of silicon nitride, there is no sharp phase boundary existing between the NSiC base body of the body and the (second) $Si_3N_4$ layer that is formed. The applied (second) layer of $Si_3N_4$, after reactive firing, has a thickness of, for example, approximately 500 µm to 1 mm; in other words, the NSiC material of the body serves only as a support for the $Si_3N_4$ layer, and determines the strength of the crucible.

In the course of the second slip casting operation, silicon particles diffuse into the green compact/body from the first casting, so that no sharp dividing line of the phase boundaries between the (first) body and the subsequent applied outer layer of silicon exists, which in the subsequent reactive firing under nitrogen is converted into $Si_3N_4$.

Instead of nitride-bonded silicon carbide, an embodiment of the base material of a crucible for photovoltaic silicon melting is carbon-based crucible material, e.g., graphite or CFC (carbon fibre-reinforced carbon). Uncoated carbon-containing crucible materials cannot be used directly for the melting of non-ferrous metals; only the coating of the present invention makes such use possible. In the case of the coating of carbon-containing materials, however, it should be provided that the thermal expansion of the graphite coincides well with the thermal expansion of silicon nitride in order to alleviate the risk of delamination of the nitride layer. Certain types of graphite (e.g., MKUS from SGL) have the advantage of a very similar coefficient of thermal expansion to the nitride-bonded silicon nitride that is subsequently applied as a layer. As a result, fractures in the layer of nitride-bonded silicon nitride on the graphite in the course of the temperature change are reduced, and hence a multiple use for the production of photovoltaic silicon melts is made possible. In contrast to nitride-bonded silicon carbide (NSiC), however, a pure silicon layer cannot be used since it reacts to form silicon carbide instead of silicon nitride. It has here surprisingly been found that only a mixture of silicon and silicon nitride powder results in a silicon nitride layer.

The production of the crucibles by the method according to the present invention is cost-effective, since the expensive pure silicon is needed only for the inner layer. The base crucible can be manufactured from industrial-quality materials, either nitride-bonded silicon carbide or graphite. In the case of the base crucible as well, however, the possibility exists of using higher purities if it appears necessary.

The application of a layer of pure silicon (prior to firing) or of pure silicon nitride (after reactive firing) to the body protects the base materials of the body from the silicon melt. Conversely, the pure silicon melt as required for photovoltaic application is not contaminated by the base materials; the problem of contamination of the silicon melt is therefore solved. The purity of the (second) silicon layer or silicon nitride layer is dependent only on the purity of the silicon raw material used, and not on the purity of the body material. The purity of the applied silicon nitride layer can therefore be controlled. For the insulating interlayer, a silicon or silicon nitride can, for example, be used whose purity is identical with that of the product to be thereafter produced, the silicon melt. For the silicon melt, solar silicon or ultra-high-purity silicon is generally used. The insulating interlayer, however, should not cause any impurity to pass into the silicon melt. If, when using commercially available grades of silicon or of silicon nitride with good purity (Vesta Ceramics, Grade 4, Type E silicon or Elkem silicon HQ), the purity of the silicon melt suffers deterioration, it is also possible to use silicon or silicon nitride of higher purity for producing the insulating interlayer.

Silicon nitride is not wettable by melts of non-ferrous metals. The coated crucible can be used, accordingly, for a melt of silicon.

In an embodiment of the present invention, workpieces can be produced which are especially suitable for use in operations in melt metallurgy. The present invention also provides such workpieces, and also components which can be produced from the workpieces.

EXAMPLES

In order to produce a crucible system composed of two layers on the basis of nitride-bonded silicon carbide, first of all, in accordance with a formula, a slip was produced of nitride-bonded silicon carbide comprising the following constituents:

Example 1

45% by weight of coarse silicon carbide having a particle size of approximately 100 µm 36% by weight of fine silicon carbide having a BET surface area of approximately 7 m²/g 17% by weight of silicon powder having a particle size of 0-45 μm, from Elkem 2% by weight of aluminum oxide ($Al_2O_3$)

The constituents were homogenized in an aqueous slip with a solids content of approximately 84% and, after a calming phase for degassing of the air incorporated by stirring, were cast into a plaster mould having the desired geometry of the ultimate component. After a standing time of 15 to 30 minutes, or after the desired wall thickness had been built up, the slip was emptied from the plaster mould. This step was used to produce the base body, occasionally also called simply the body. The body of the base body is preferably not removed from the plaster mould.

The plaster mould was subsequently filled immediately (that is without waiting)—with a slip of pure silicon powder again until an additional layer with a thickness of approximately 1 to 2 mm was built up, this layer deriving from the slip comprising the pure silicon powder. This slip possesses a very high solids content, in the range from 50% to 70%. The casting time was approximately 2 to 5 minutes. The pure silicon powder used possessed a particle size distribution of $D_{98} \leq 20$ μm and/or $D_{50} \leq 4$ μm, measured with a Coulter Beckmann 13320 granulometer in accordance with standard ISO 13320.

The silicon powder used in this step should have the highest available purity. As a standard, Si HQ from Elkem is used. It is also possible here to use fine solar silicon powder.

The crucible produced in this way, after a drying phase, was removed from the plaster mould and subjected to residual drying at approximately 80 to 120° C. This was followed by reactive firing under flowing nitrogen gas at a temperature in the range from 1400 to 1600° C., in the course of which all of the silicon was converted into silicon nitride.

A crucible was obtained and its wall viewed in cross section. FIG. 1 shows a picture taken with a scanning electron microscope. Visible in the left half of the picture is a coarsely particulate silicon carbide structure, embedded in a matrix of silicon nitride and finely particulate silicon carbide. The right-hand half of the picture shows finely particulate silicon nitride formed by reactive firing from the slip containing pure silicon. There is no defined phase boundary; this is the reason why the outer layer does not flake off from the support but instead adheres firmly to it.

Figure 2:
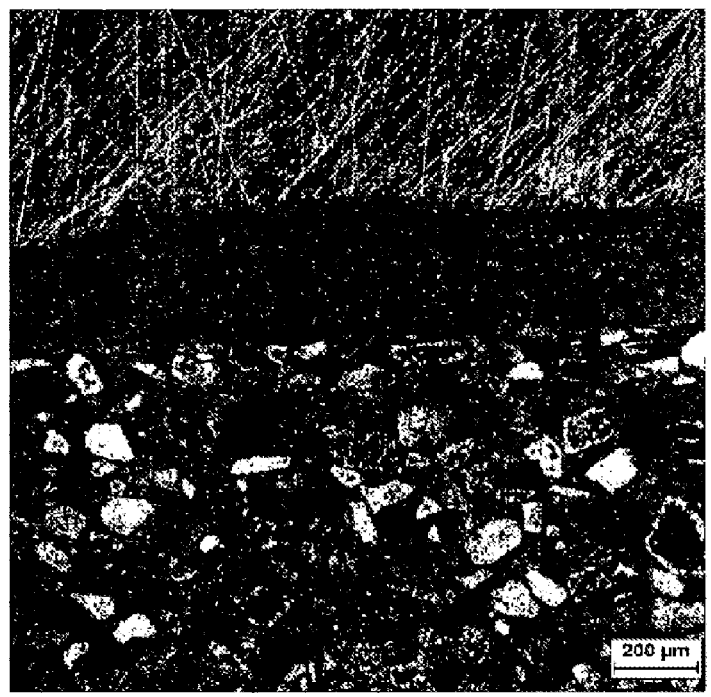
FIG. 2 is a light-microscope picture which shows a construction made up of three horizontal bands.

FIG. 2 shows a light-microscope picture which shows a construction made up of three horizontal bands. The bottom band shows the base body of nitride-bonded silicon carbide (NSiC) with coarse SiC particles, which are embedded in a finely particulate matrix of $SiC+Si_3N_4$. The middle layer shows a pure, finely particulate $Si_3N_4$ layer. The top layer relates to the embedding agent necessary for the preparation; the embedding agent has no relation to the material and is only necessary for preparation purposes. As in FIG. 1, there is no phase boundary apparent here either; the phase transition, instead, is a fluid one, resulting in particularly good adhesion of the $Si_3N_4$ outer layer to the body.

Example 2

The base batch, i.e., the base body or base crucible, used was the same as in Example 1. Instead of a further slip comprising a pure silicon powder, the additional silicon layer according to this embodiment was applied by means of a spraying process. As a result of this process, in comparison with the slip casting process of Example 1, it was possible to apply thinner layers, and, moreover, less slip comprising the expensive pure silicon was required.

Example 3

A commercially available graphite crucible was used as the base body, and was sprayed with a slip of exclusively pure silicon powder as in Example 1. It was subsequently treated as in Example 1, i.e., subjected to residual drying and to reactive firing in a stream of nitrogen.

Figure 3:
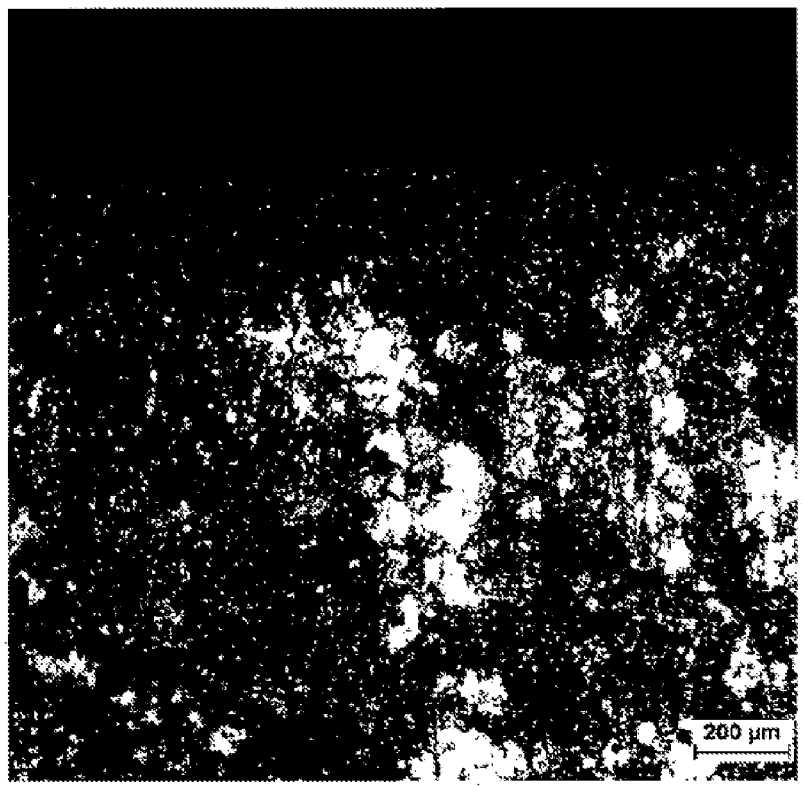
FIG. 3 is a light-microscope picture showing a layer of silicon carbide formed on the graphite base material.

As shown in the light-microscope picture in FIG. 3, a layer of silicon carbide was formed on the graphite base material. The coated graphite crucible obtained was unsuitable for use for producing solar silicon since the silicon carbide would contaminate the silicon melt. The bottom layer in the light-microscope picture represents the graphite of the crucible, the middle layer the layer of silicon carbide formed; the apparent top "layer" is a product of the photograph and is immaterial to the present invention.

Example 4

A commercially available graphite crucible was used as base body and was sprayed with a slip comprising 30% by weight pure silicon powder and 70% by weight pure silicon nitride powder. It was subsequently subjected, as in Example 1, to residual drying and to reactive firing in a stream of nitrogen.

Figure 4:
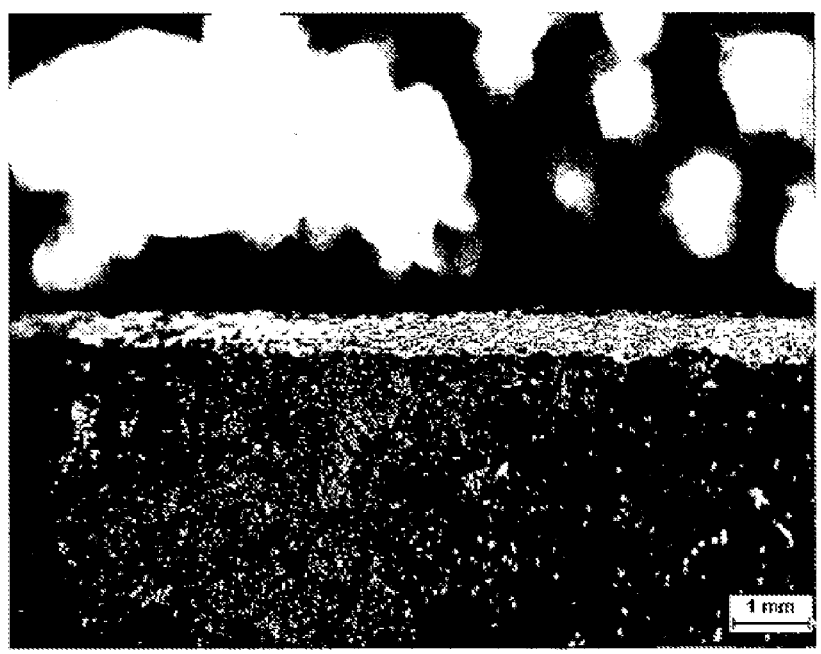
FIG. 4 is a light-microscope picture where the bottom layer shows the graphite material of the base body and the middle layer shows the silicon nitride formed in the insulating layer.

The result is shown in FIG. 4. Surprisingly and unexpectedly, when the pure silicon powder was "diluted" with 70% by weight silicon nitride, a layer of nitride-bonded silicon nitride was formed. The percentages are based on the sum of Si and $Si_3N_4$. This finding contrasts with the use of the pure silicon in Example 3 and FIG. 3, an experiment in which predominantly silicon carbide was formed.

Figure 5:
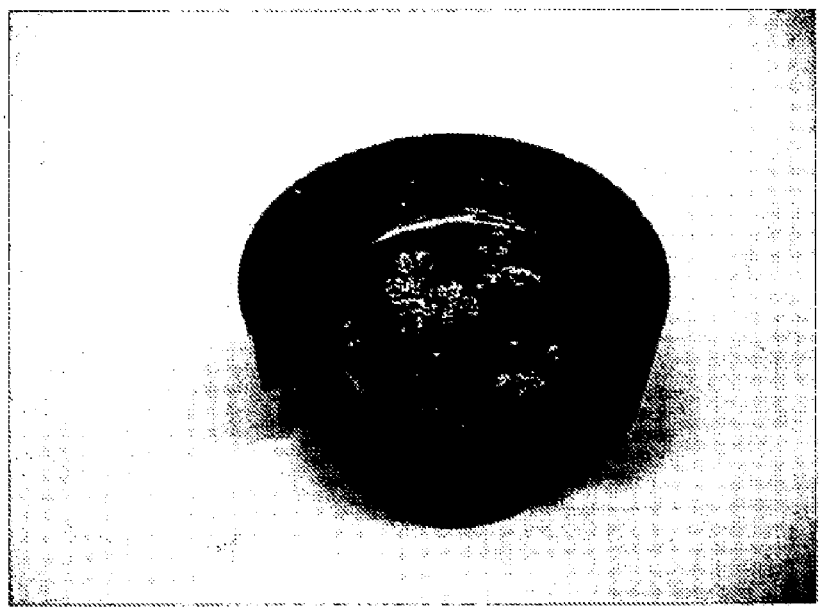
FIG. 5 shows the graphite crucible broken open.

In the light-microscope picture of FIG. 4, the bottom layer shows the graphite material of the base body, and the middle layer shows the silicon nitride formed in the insulating layer; the apparent top "layer" represents the silicon reflecting in the background (see also FIG. 5).

Finally, then, the silicon was introduced into a silicon nitride-coated graphite crucible, from FIG. 4, and melted at 1580° C., in order to subject the crucible to realistic actual loading. After the melt had cooled, the graphite crucible was sawn apart in order to determine the suitability of the crucible and of the insulating layer of silicon nitride. The broken open graphite crucible is depicted in FIG. 5. On the side facing the viewer, a white layer is evident on the silicon block; this is the insulating silicon nitride layer formed by the reactive firing. The graphite crucible shown is suitable for use for the melting of silicon; it withstood the silicon melting process, and the base shows no wetting with silicon.

Example 5

This example shows the possibility of using other carbon-based materials instead of graphite. The procedure is in principle the same as in Example 4, but with the following differences relative to said Example: instead of a graphite crucible, a crucible material made from a carbon reinforced with carbon fibres (carbon fibre-reinforced carbon, CFC) was used. The slip for the layer was applied by rolling.

Figure 6:
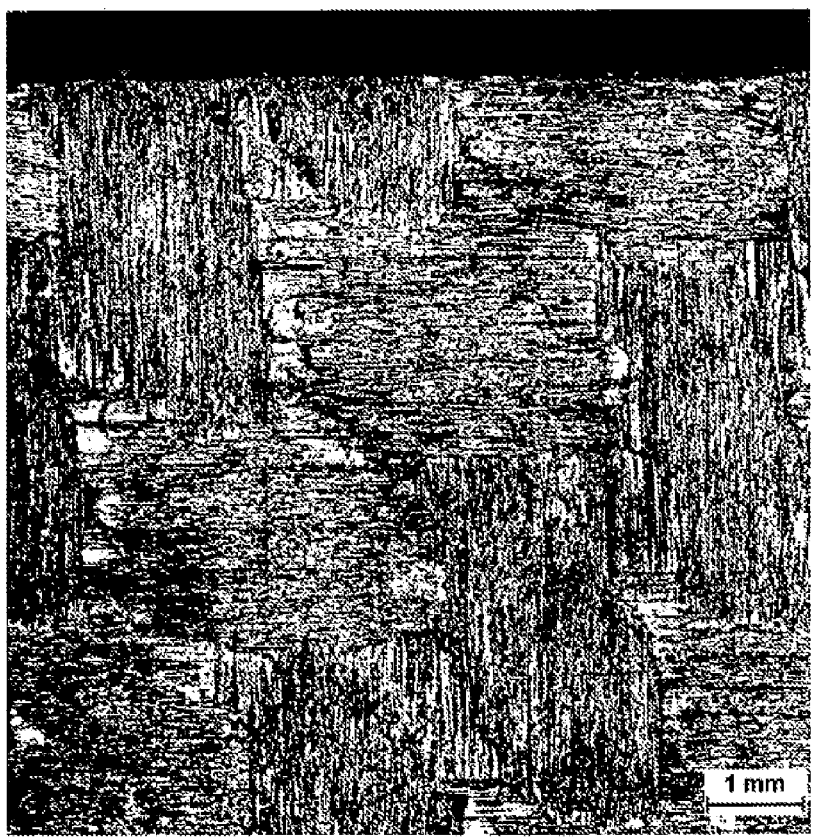
FIG. 6 shows a light-microscope picture of a CFC plate from the uncoated side.
Figure 7:
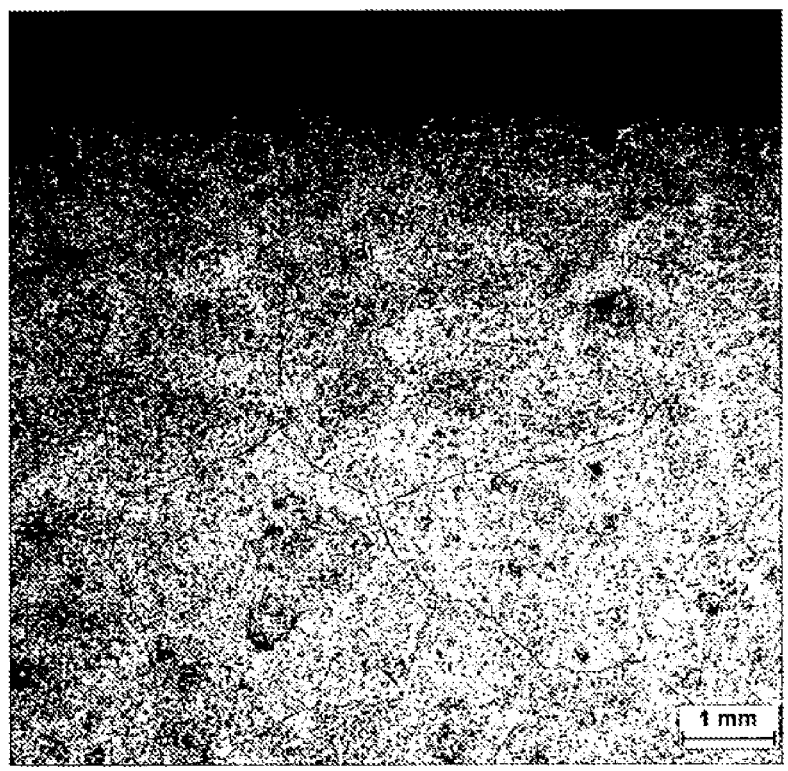
FIG. 7 shows a light-microscope picture of a CFC plate from the coated side of the plate.
Figure 8:
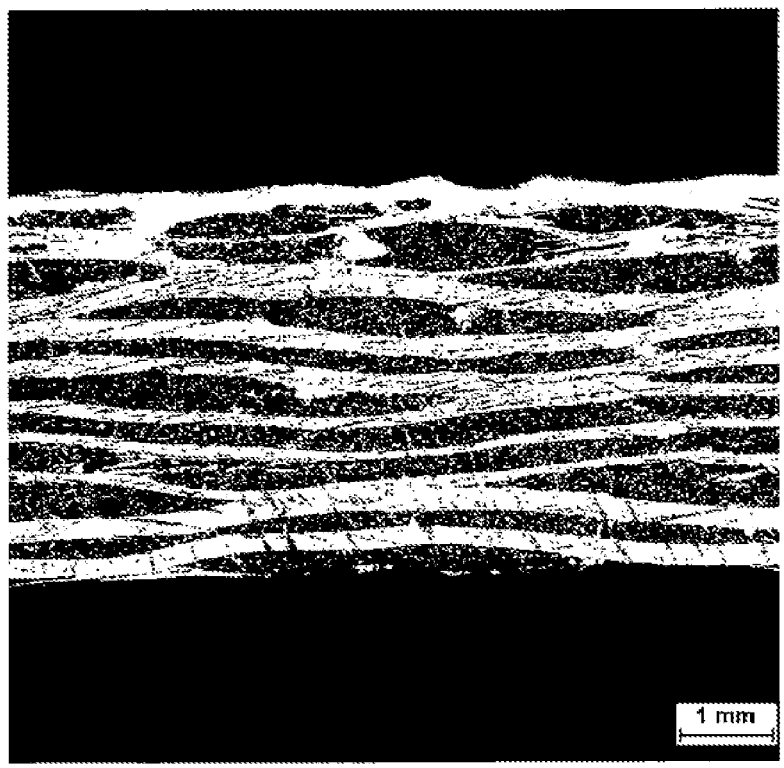
FIG. 8 shows a light-microscope picture of a cross section/side view of a CFC plate.
Figure 9:
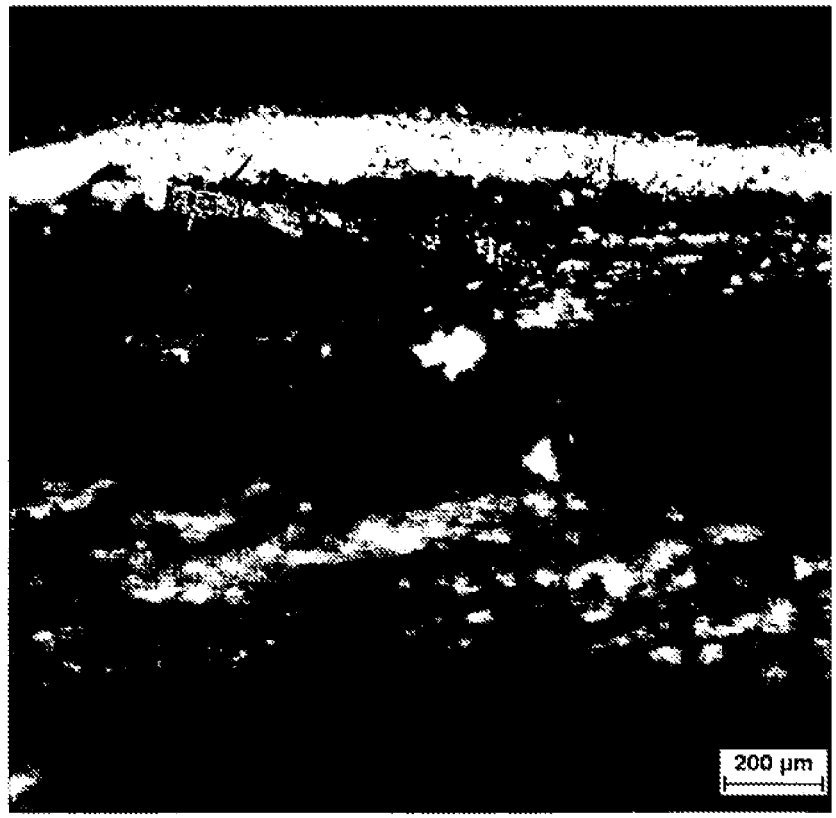
FIG. 9 shows a detail of FIG. 8.

FIGS. 6 to 9 associated with Example 5 all represent light-microscope pictures of the same CFC plate, from different perspectives. FIG. 6 shows the uncoated side, FIG. 7 the coated side of the plate. FIG. 8 shows the cross section, i.e., a side view, and FIG. 9 is a detail of FIG. 8.

FIG. 6 shows a picture of the woven-fabric structure of an uncoated plate of the crucible material comprising carbon fibre-reinforced carbon, in a flat view. Readily apparent in this picture are the regularly arranged, almost square zones with differently oriented fibres of the CFC fabric. In FIG. 7, the same plate can be seen, again in a flat view, but with a layer of nitride-bonded silicon nitride (i.e., NSN). The fine crack structure is attributable to the unevenness of the plate; this, however, is not a problem in relation to the contact of the silicon melt with the crucible material.

FIG. 8 shows a side view of the same CFC plate (see FIG. 7) in cross section, the plate being coated with nitride-bonded silicon nitride. The topmost layer represents the layer of nitride-bonded silicon nitride; as a result of the nitriding reaction, this NSN layer is firmly connected to the carbon plate and constitutes a solid bond between layer and plate. The white lines at the bottom and the black islands situated in-between each represent carbon fibres in different orientations and woven-fabric plies. On the evidence of the scale, the layer thickness is approximately 100 μm. The layer thickness can be varied by repeat application using a roller or brush.

FIG. 9 shows a detail picture from FIG. 8. The light-coloured strip at the top again represents the layer of nitride-bonded silicon nitride; the stripes in the bottom half of the picture represent different plies of the woven-fabric CFC mats.

The present invention is not limited to embodiments described herein; reference should be had to the appended claims.

What is claimed is:

1. A method for producing a workpiece comprising a layer of an additive-free silicon nitride, the method comprising:
   providing a base body of the workpiece comprising a nitride-bonded silicon carbide;
   applying a layer of a slip comprising a silicon powder to an inside of the base body so as to obtain a coated base body; and
   subjecting the coated base body to a reactive firing under nitrogen so as to convert the silicon powder to the additive-free silicon nitride.

2. The method as recited in claim 1, wherein the silicon nitride powder used for applying the layer has a particle size distribution of at least one of $D_{98} \leq 10$ μm and $D_{50} \leq 2.5$ μm, as measured with a Coulter Beckmann 13320 granulometer in accordance with a standard ISO 13320.

3. The method as recited in claim 1, wherein the slip further comprises an inorganic fraction comprising the silicon powder.

4. The method as recited in claim 1, wherein the silicon powder used for applying the layer has a particle size distribution of at least one of $D_{98} \leq 20$ μm and $D_{50} \leq 4$ μm, as measured with a Coulter Beckmann 13320 granulometer in accordance with a standard ISO 13320.

5. The method as recited in claim 1, wherein the layer of the slip comprising the silicon powder is applied by at least one of a slip casting, a spraying process, and a brushing process.

6. The method as recited in claim 1, wherein the reactive firing of the slip forms an insulating interlayer, the insulating interlayer having a thickness of from 0.2 to 2.0 mm after the reactive firing.

7. A workpiece comprising a layer of an additive-free silicon nitride, the workpiece being produced by a method comprising:
   providing a base body of the workpiece comprising a nitride-bonded silicon carbide;
   applying a layer of a slip comprising a silicon powder to an inside of the base body so as to obtain a coated base body; and
   subjecting the coated base body to a reactive firing under nitrogen so as to convert the silicon powder to the additive-free silicon nitride.

8. A component produced from the workpiece as recited in claim 7.

9. A method for producing a workpiece comprising a layer of an additive-free silicon nitride, the method comprising:
   providing a base body of the workpiece comprising a material selected from the group consisting of a carbon fibre-based carbon (CFC), and a mixture a graphite and the carbon fibre-based carbon (CFC);
   applying a layer of a slip comprising a silicon powder and a silicon nitride powder to an inside of the base body so as to obtain a coated base body; and
   subjecting the coated base body to a reactive firing under nitrogen so as to convert the silicon powder to the additive-free silicon nitride.

10. The method as recited in claim 9, wherein the slip comprises 55 to 90 wt.-% silicon nitride and 10 to 45 wt.-% silicon, based on the sum of silicon and silicon nitride.

11. The method as recited in claim 9, wherein the silicon nitride powder used for applying the layer has a particle size distribution of at least one of $D_{98} \leq 10$ μm and $D_{50} \leq 2.5$ μm, as measured with a Coulter Beckmann 13320 granulometer in accordance with a standard ISO 13320.

12. The method as recited in claim 9, wherein the silicon powder used for applying the layer has a particle size distribution of at least one of $D_{98} \leq 20$ μm and $D_{50} \leq 4$ μm, as measured with a Coulter Beckmann 13320 granulometer in accordance with a standard ISO 13320.

13. The method as recited in claim 9, wherein the layer of the slip comprising the silicon powder is applied by at least one of a slip casting, a spraying process, and a brushing process.

14. The method as recited in claim 9, wherein the reactive firing of the slip forms an insulating interlayer, the insulating interlayer having a thickness of from 0.2 to 2.0 mm after the reactive firing.

15. A workpiece comprising a layer of an additive-free silicon nitride, the workpiece being produced by a method comprising:
   providing a base body of the workpiece comprising a material selected from the group consisting of a carbon fibre-based carbon (CFC), and a mixture a graphite and the carbon fibre-based carbon (CFC);
   applying a layer of a slip comprising a silicon powder and a silicon nitride powder to an inside of the base body so as to obtain a coated base body; and
   subjecting the coated base body to a reactive firing under nitrogen so as to convert the silicon powder to the additive-free silicon nitride.

16. A component produced from the workpiece as recited in claim 15.

* * * * *